United States Patent [19]

Lavochkin

[11] Patent Number: 4,509,839
[45] Date of Patent: Apr. 9, 1985

[54] HEAT DISSIPATOR FOR SEMICONDUCTOR DEVICES

[75] Inventor: Ronald B. Lavochkin, Commack, N.Y.

[73] Assignee: IMC Magnetics Corp., Jericho, N.Y.

[21] Appl. No.: 504,726

[22] Filed: Jun. 16, 1983

[51] Int. Cl.[3] .................... H01L 23/02; H01L 23/42
[52] U.S. Cl. ........................................ 357/81; 357/79; 165/80 A
[58] Field of Search ................. 357/81, 79; 165/80

[56] References Cited

U.S. PATENT DOCUMENTS

| | | | |
|---|---|---|---|
| 3,548,927 | 12/1970 | Spurling | 357/81 |
| 3,572,428 | 3/1971 | Monaco | 357/81 |
| 3,694,703 | 9/1972 | Wilens et al. | 357/81 |
| 4,054,901 | 10/1977 | Edwards et al. | 357/81 |
| 4,215,361 | 7/1980 | McCarthy | 357/68 |
| 4,235,285 | 11/1980 | Johnson et al. | 357/81 |
| 4,421,161 | 12/1983 | Romania et al. | 357/81 |

Primary Examiner—Andrew J. James
Assistant Examiner—Mark Prenty
Attorney, Agent, or Firm—Alan H. Levine

[57] ABSTRACT

A heat dissipator including a thermally conductive material having a face adapted to contact a semiconductor to be cooled, and a clip for engaging the body and resiliently clamping the semiconductor device against the contact face. The clip has at least one attachment element which, like the leads of the semiconductor device, projects beyond one edge of the dissipator body, the attachment elements being used to join the body and hence the semiconductor device to a support, such as a printed circuit board. The clip may be formed of a solderable material which is different from the material of which the body is formed. The clip may be a single length of bent spring wire, or piece of bent sheet metal.

15 Claims, 16 Drawing Figures

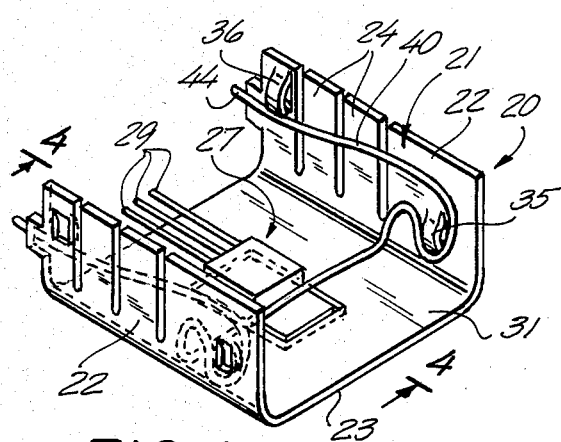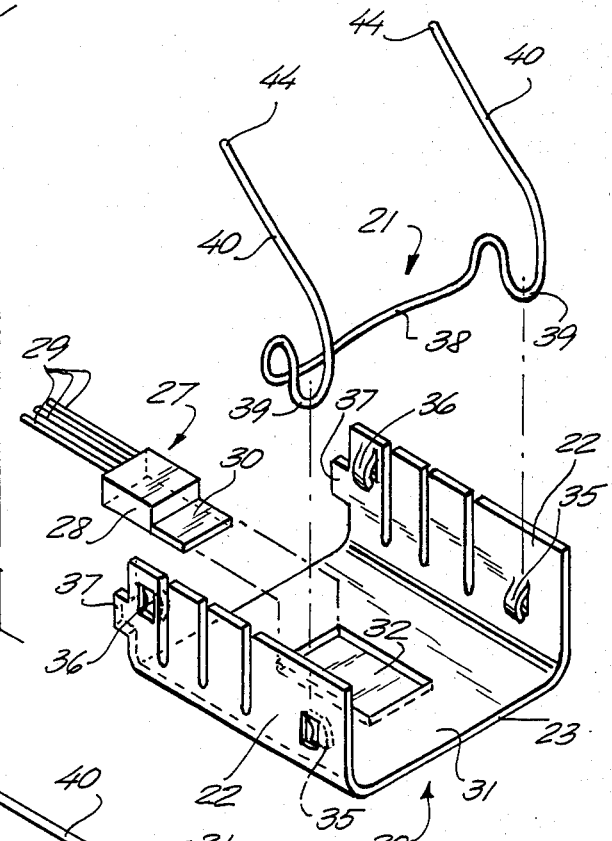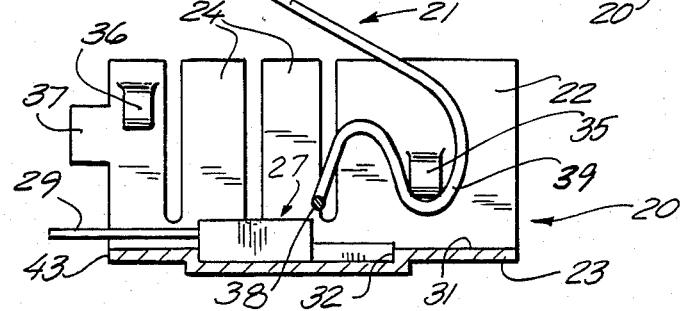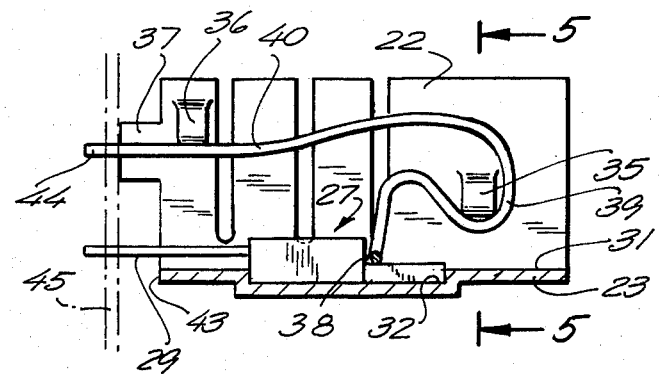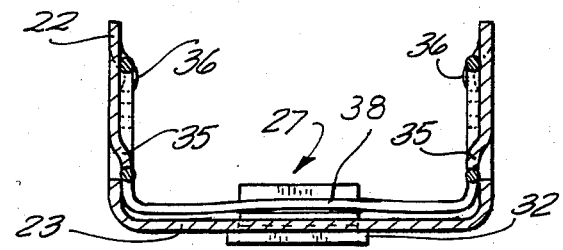

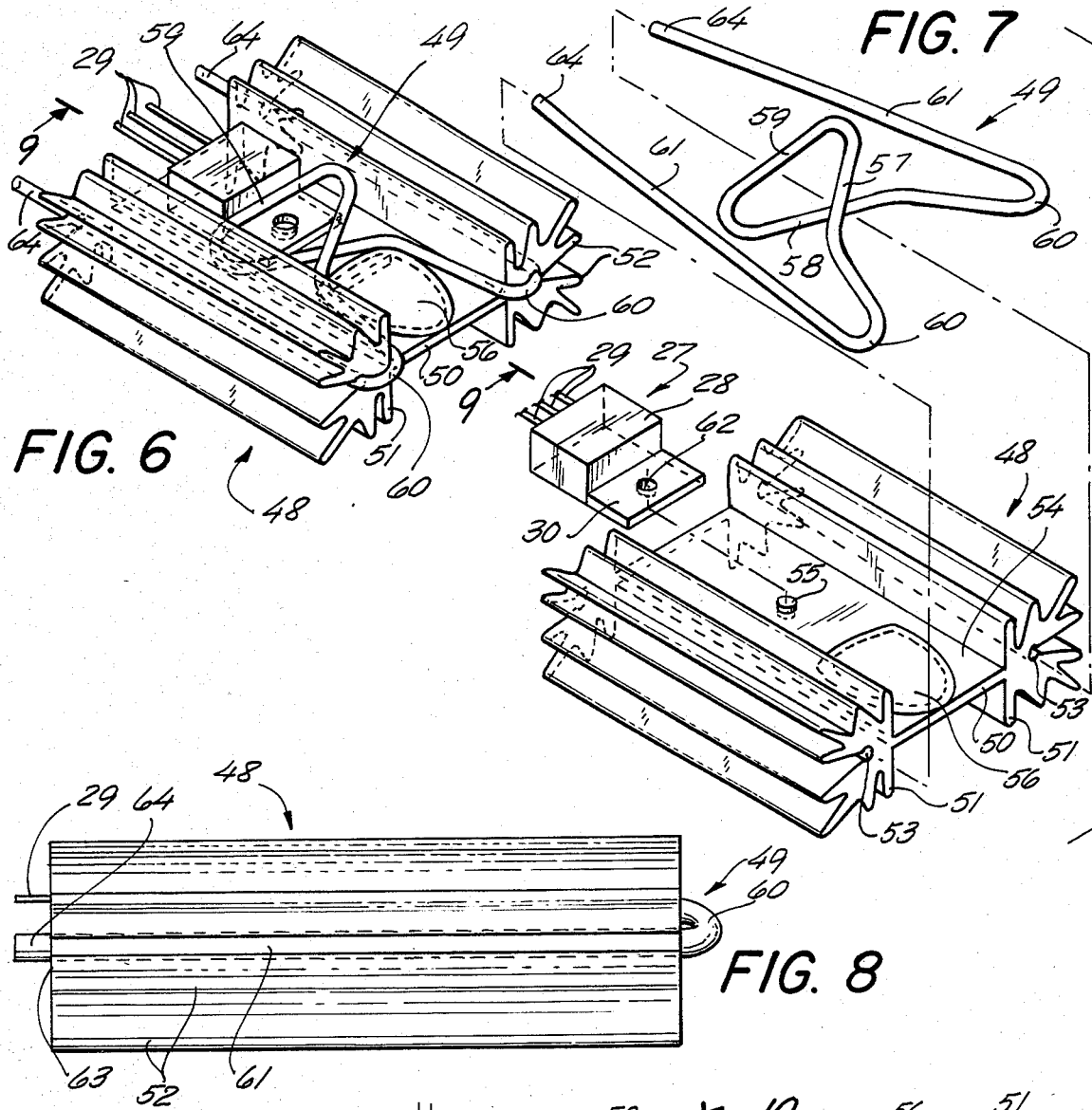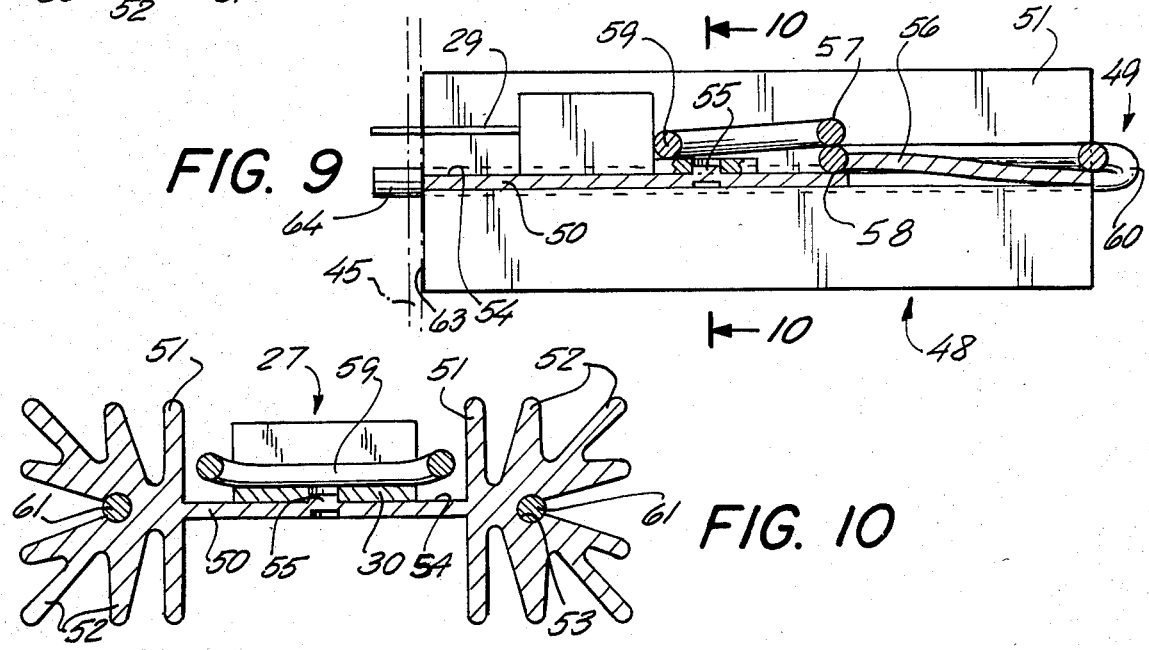

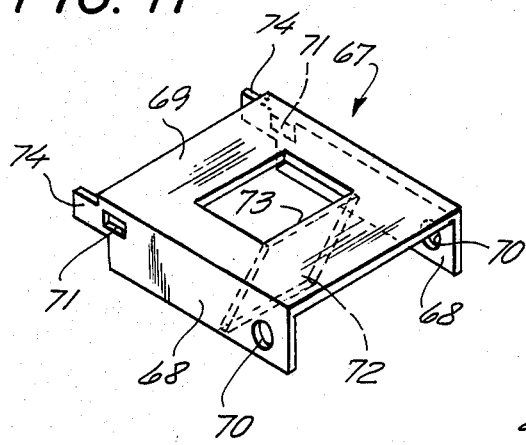
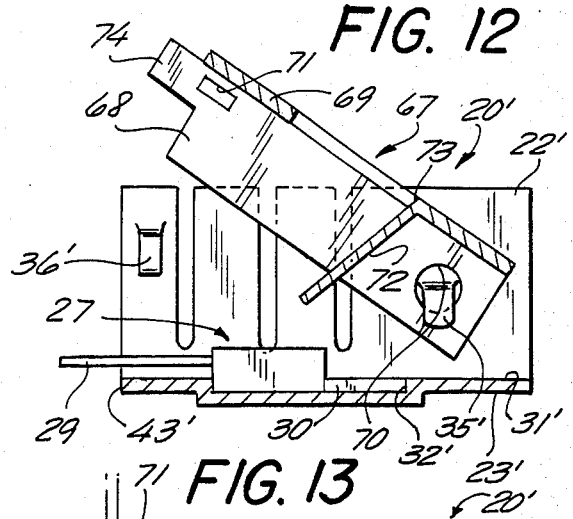
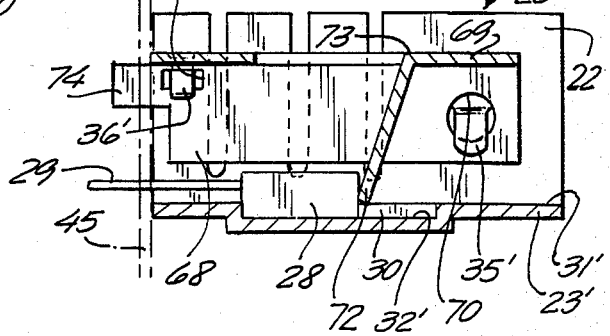
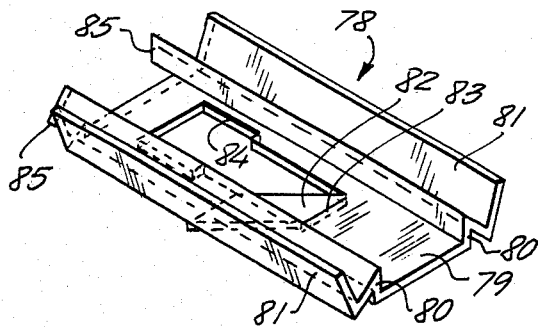
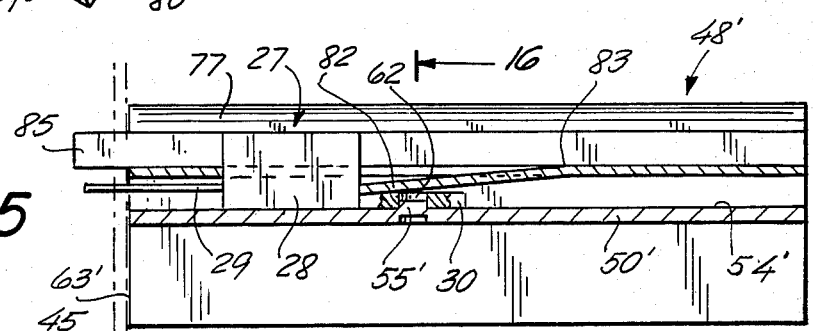
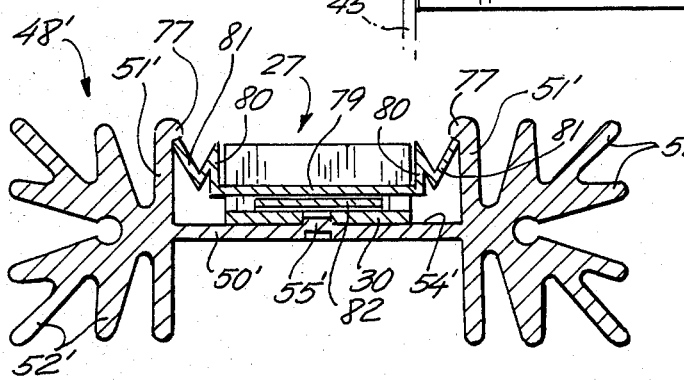

HEAT DISSIPATOR FOR SEMICONDUCTOR DEVICES

This invention relates to heat dissipators, also referred to as to heat sinks, for use with semiconductor devices, such as transistors, diodes, and triacs.

Many semiconductor devices generate heat which, if not dissipated, can raise the temperature of the device sufficiently to damage it. Therefore, it is common practice to attach a heat dissipator to such a semiconductor device which absorbs heat from the device and transfers the heat to the surrounding atmosphere.

Typically, a semiconductor device is furnished with a heat transmitting surface which can be attached by a mechanical fastener, such as a machine screw, to a heat dissipator. The assembled semiconductor device and heat dissipator are then attached to a support, such as a printed circuit board. An advantage of using a mechanical fastener, such as a screw, is that sufficient contact pressure can be created between the heat transmitting surface of the semiconductor device and the heat dissipator, for good heat conduction between the plate and the heat dissipator. A disadvantage of using a mechanical fastener, such as a screw, involves both the cost of the screw and the cost of the time-consuming assembly procedure employing a screw.

For this reason, heat dissipators have been suggested which resiliently grip the semiconductor device, thus eliminating the need for a mechanical fastener such as a screw. However, each of these heat dissipators is encumbered by one or another disadvantage which makes it less than ideal for its intended purpose. For example, the heat dissipators illustrated and described in U.S. Pat. Nos. 4,012,769; 4,215,361; and 4,235,285 each resiliently grips the semiconductor device with which it is used. However, none of these heat dissipators provides means for attaching the heat dissipator to a support, such as a printed circuit board.

U.S. Pat. No. 3,548,927 shows a heat dissipator to which a semiconductor device is secured by means of a resilient clip. However, attachment of the heat dissipator to a support is accomplished by means of screws which pass through holes in the heat dissipator. This involves a time-consuming assembly operation.

In U.S. Pat. No. 4,054,901, a heat dissipator is shown which resiliently grips a semiconductor device, and which is formed with integral attachment tabs for joining the heat dissipator to a support. However, this heat dissipator has two distinct disadvantages. First, the member which resiliently presses the semiconductor device against the heat dissipator is a reversely bent portion of the piece of material forming the heat dissipator. Consequently, the amount of contact pressure which this member can create between the semiconductor device and the heat dissipator is limited. Since the heat conduction between the semiconductor and the heat dissipator is a function of the contact pressure between them, it is important that the contact pressure be sufficient. The heat dissipator of this patent falls short of providing the requisite contact pressure. Secondly, since the attachment tabs of this heat dissipator are formed of the same piece of material as the remainder of the heat dissipator, the entire heat dissipator must be formed of a relatively expensive solderable material, such as copper, so that the attachment tabs can be soldered to the support, or if the heat dissipator is made of a less expensive material, such as aluminum, which cannot be soldered, the attachment tabs must be plated with a solderable material, such as zinc or copper. In either case, the cost of the heat dissipator increases considerably.

It has also been suggested to make a heat dissipator of a relatively inexpensive, non-solderable material, and attaching solderable tabs to the dissipator. While this involves a saving in material cost, the cost of attaching the separate tabs increases the total cost of manufacture.

It is an object of the present invention to provide a heat dissipator for a semiconductor device which resiliently grips the semiconductor with sufficient force to provide high contact pressure between the semiconductor and the heat dissipator. Coordinately, it is an object of the invention to provide a heat dissipator including a body, which may be formed of a relatively inexpensive material, and a resilient clip, which may be formed of a solderable material, the clip not only serving to press the semiconductor device against the heat dissipator body, but also providing projections which extend beyond the heat dissipator body and serve as means for attaching the heat dissipator, and hence the semiconductor device, to a support such as a printed circuit board. It is another object of the invention to provide such a heat dissipator wherein the body and clip are inexpensive to manufacture, and which can easily and rapidly be assembled with a semiconductor device.

Additional objects and features of the invention will be apparent from the following description, in which reference is made to the accompanying drawings.

In the drawings:

FIG. 1 is a perspective view of one embodiment of a heat dissipator, according to the present invention, assembled with a semiconductor device;

FIG. 2 is an exploded perspective view of the semiconductor device and the heat dissipator body and clip;

FIG. 3 is a longitudinal cross-sectional view showing the heat dissipator with the clip in an intermediate position during assembly of the semiconductor device with the heat dissipator;

FIG. 4 is a longitudinal cross-sectional view taken along line 4—4 of FIG. 1;

FIG. 5 is a transverse cross-sectional view taken along line 5—5 of FIG. 4;

FIG. 6 is a perspective view of a second embodiment of a heat dissipator, according to the present invention, assembled with a semiconductor device;

FIG. 7 is an exploded perspective view of the semiconductor device and the body and clip of the heat dissipator;

FIG. 8 is a side elevational view of the assembled heat dissipator body and clip;

FIG. 9 is a longitudinal cross-sectional view taken along line 9—9 of FIG. 6;

FIG. 10 is a transverse cross-sectional view taken along line 10—10 of FIG. 9;

FIG. 11 is a perspective view of an alternative embodiment of the clip shown in FIG. 1;

FIG. 12 is a view similar to FIG. 3 showing the clip of FIG. 11 in an intermediate stage of assembly with the heat dissipator body;

FIG. 13 is a view similar to FIG. 4 showing the final assembly of the heat dissipator and semiconductor device;

FIG. 14 is a perspective view of another embodiment of a clip;

FIG. 15 is a longitudinal cross-sectional view showing the clip of FIG. 14 assembled with a heat dissipator body and a semiconductor device; and FIG. 16 is a transverse cross-sectional view taken along line 16—16 of FIG. 15.

One embodiment of a heat dissipator chosen to illustrate the present invention, and shown in FIGS. 1-5, includes a heat dissipator body 20 and a clip 21. Body 20 is preferably formed of an initially flat piece of sheet metal bent into a U-shape to create two upstanding walls 22 joined by a central portion 23. Each wall 22 is provided with a series of parallel slots defining fins 24 which help to dissipate heat absorbed by body 20.

The heat dissipator is used with a conventional semiconductor device 27 including a plastic body 28, within which the semiconductor is encapsulated, electrical leads 29 extending from the plastic body, and a thermal transmission plate 30 extending along and from one face of the plastic body 28. When semiconductor device 27 is assembled with the heat dissipator, thermal transmission plate 30 is pressed into contact with the face 31, of body central portion 23, which faces in the direction in which walls 22 project from central portion 23. Contact face 31 is formed with means for locating semiconductor device 27 in a desired position with respect to body 20. In the present example, the locating means is a rectangular depression 32 about equal to, or slightly larger than, the dimensions of thermal transmission plate 30.

Each upstanding wall 22 of body 20 is formed with a finger 35 which is struck out of the material of the wall which carries it and projects toward the opposite wall 22. Fingers 35 define, between them, a pivot axis about which clip 21 swings during the assembly operation, as will be described below. Each wall 22 also carries a locking element 36 struck out of the material of the wall which carries it and which projects toward the opposite wall 22. A spacer tab 37 projects from each wall 22.

Clip 21 is formed of a single length of spring wire, and is bent to define a substantially straight central portion 38, loops 39 at each end of central portion 38, and spring arms 40.

Clip 21 preassembled with heat dissipator 20 by being placed between upstanding walls 22, loops 39 being snapped over fingers 35. The inherent resilience of clip 21 permits this movement. Each loop 39 is free to slide around its respective finger 35, and in this way fingers 35 define pivot points about which clip 21 can rotate. The heat dissipator 20, with preassembled clip 21, is ready to receive semiconductor device 27.

The semiconductor device 27 is placed within depression 32. In this location, leads 29 extend beyond the edge 43 of body central portion 23, and even beyond the edge of spacer tab 37, as best seen in FIGS. 3 and 4. Clip 21, which may be in the relative position illustrated in FIG. 3, is then rotated in a counterclockwise direction to the position illustrated in FIG. 4. At this point, each spring arm 40 is snapped beneath one of the locking elements 36. At the same time, central portion 38 of the clip is pressing down upon the upper surface of thermal transmission plate 30 of semiconductor device 27. In this way, a very strong force is applied to plate 30, thereby creating a high contact pressure between plate 30 and contact face 31 of body 20. It will be noted that clip 21 serves the purpose of mounting the semiconductor device 27 on body 20, and hence the central portion 38 of clip 21 could engage the plastic body 28 of the semiconductor device instead of the plate 30.

The free ends 44 of spring arms 40 project beyond edge 43 of body 20, and also beyond the edges of spacer tabs 37. The assembled semiconductor device and heat dissipator can now be mounted, in the usual way, on a support, such as a printed circuit board 45 indicated in broken lines in FIG. 4. Board 45 has openings through which electrical leads 29 pass so that their free ends can be soldered to the electrical circuit carried by the board. Board 45 also has openings through which the free ends 44 of clip 21 pass so that these ends can be soldered to a suitable element carried by the board. It will be appreciated, therefore, that clip 21 serves two functions, namely, securing semiconductor device 27 to body 20, and providing means for attaching the semiconductor and heat dissipator assembly to a support.

An advantage of the invention is that heat dissipator 20 can be made of a relatively inexpensive thermally conductive material, such as aluminum, which is not solderable, since no part of body 20 serves as an attachment means for the assembly. Clip 21 can be formed of a poorly heat-conductive material such as steel wire, which is also not expensive and which is solderable, so that the free ends of the wire can serve as attachment elements for soldering to a support such as a printed circuit board.

Another embodiment of the invention is illustrated in FIGS. 6-10. The heat dissipator of this embodiment includes a body 48 and a clip 49. Body 48 may be an extrusion of a thermally conductive material, preferably a metal such as aluminum. The body has a central web 50 flanked by two side walls 51. Outwardly of each side wall is an array of longitudinally extending cooling fins 52. Extending longitudinally along each array of fins is a channel 53 having a partly circular cross-sectional shape. One face 54 of web 50, which is to be contacted by the semiconductor device 27, is provided with a short upstanding locating post 55. Face 54 is also formed with a ramp 56 which rises from one edge of web 50 toward post 55 and then terminates abruptly at a point spaced from post 55.

Clip 49 is formed of a single length of spring wire, which may be steel, and is bent to define a substantially straight central portion 59. At the ends of central portion 59, the wire is bent into a crisscross shape defining cross members 57 and 58, and at each end of the crisscross the wire is bent again at 60 to define substantially straight arms 61.

Clip 49 is preassambled with heat dissipator 48 by inserting the free ends 64 of clip arms 61 into the open ends of channels 53; the clip is pushed so that arms 61 move longitudinally along the channels. When central portion 59 of clip 49 reaches the edge of web 50 where ramp 56 is located, central portion 59 rides up along the ramp, thereby stressing the clip by moving central portion 59 to a position spaced above contact face 54. As clip central portion 59 passes the end of ramp 56, it remains spaced above contact face 54 since cross member 58 has now ridden up on to ramp 56. At this point, preassembly of the clip and heat dissipator is complete.

The semiconductor device 27 is placed on contact face 54 of body 48 with post 55 extending through the usual hole 62 provided in the thermal transmission plate 30 of the semiconductor device. This locates the semiconductor device so that leads 29 extend beyond the edge 63 of body 48, as best seen in FIGS. 8 and 9.

Movement of clip 49 in the direction described above, i.e., toward semiconductor device 27, is now continued. When cross member 58 reaches the end of ramp 56, both the cross member and central portion 59 snap downwardly toward contact face 54. As a result, central portion 59 contacts the exposed surface of plate 30 (see FIGS. 6, 9, and 10). In addition, bends 60 of the clip have reached body 48, as illustrated in FIGS. 6, 8, and 9.

At this point, central portion 59 pressing upon plate 30 provides a high contract pressure between plate 30 and contact face 54 of body 48. Moreover, the free ends 64 of arms 61 project beyond edge 63 of dissipator body 48. As described above, with respect to the embodiment of FIGS. 1–5, leads 29 and the free ends 64 pass through openings in a printed circuit board 49 so as to permit attachment of ends 64 to the board and attachment of leads 29 to the electrical circuit. Thus, here again, clip 49 serves the dual function of attaching semiconductor device 27 to heat dissipator body 48, and also providing attachment means 64 for joining the semiconductor device and heat dissipator assembly to the printed circuit board.

Some means other than ramp 56 could be used to space the central portion 59 of clip 49 above contact face 54 until the central portion is in the proper location to snap down on plate 30. For example, the inner face of each side wall 51 could be formed with a longitudinally extending rail spaced above contact face 54. As arms 61 slide into channels 53, the ends of central portion 59 are caused to ride upon the rails. Near the location of plate 30, each rail terminates, so that as clip 49 comes to the end of its movement into body 48, central portion 59 leaves the rails and snaps down upon plate 30.

The embodiment of a heat dissipator, according to the present invention, illustrated in FIGS. 11–13, employs a body 20' similar to the body 20 shown in FIGS. 1–5. Therefore, the parts of body 20' similar to those parts shown in FIGS. 1–5 bear the same reference numerals as are used in the earlier figures followed by a prime. In this case, spring wire clip 21 is replaced with a clip 67 made of bent sheet material, such as a suitable metal.

Clip 67 has a U-shape defining two parallel arms 68 connected by a central bridge 69. Each arm is formed with a hole 70 adapted to cooperate with the fingers 35' projecting from the walls 22' of body 20'. Each arm 68 also has an aperture 71 adapted to cooperate with the locking elements 36' projecting from each wall 22' of body 20'. Central bridge 69 carries a resilient tongue 72 formed by cutting and bending a portion of the material of the bridge. The inherent resilience of the clip material causes tongue 72 to be joined to bridge 69 by, in effect, a resilient hinge 73, constituting the line along which tongue 72 is folded out of the plane of bridge 69.

As with the prior embodiments, clip 67 is preassembled with heat dissipator 20' by being placed between upstanding walls 22' and holes 70 snapped over fingers 35'. The inherent resilience of clip 67 permits this movement. The edge of each hole is free to slide around its respective finger 35', and in this way fingers 35' define that pivot points about which clip 67 can rotate. The heat dissipator 20', with preassembled clip 67, is ready to receive semiconductor device 27.

The semiconductor device 27 is first placed within depression 32' formed in contact face 31'. In this location, leads 29 of the semiconductor device extend beyond the edge 43' of body central portion 23', as shown in FIGS. 12 and 13. Clip 67 is then rotated in a counterclockwise direction from the position of FIG. 12 to that of FIG. 13. At this point, each aperture 71 is snapped over one of the locking elements 35'. At the same time, resilient tongue 72 is pressing down upon the upper surface of thermal transmission plate 30 of semiconductor device 27. In this way, a very strong force is applied to plate 30, thereby creating a high contact pressure between plate 30 and contact face 31' of body 20'.

Attachment tabs 74 projecting from arms 68 also project beyond edge 43' of body 20'. The assembled semiconductor device and heat dissipator can now be mounted on a support, such as a printed circuit board 45 (FIG. 13). As described above, board 45 has openings through which electrical leads 29 and attachment tabs 74 pass, so that the leads can be connected to the electrical circuit and the tabs can be soldered to the board.

The embodiment of a heat dissipator, according to the present invention, illustrated in FIGS. 14–16 employs a body 48' similar to the body 48 shown in FIGS. 6–10. Therefore, the parts of body 48' similar to those parts shown in FIGS. 6–10 bear the same reference numerals as are used in the earlier figures followed by a prime. One difference between body 48' and previously-described body 48 is that each side wall 51' is formed with a lip 77, extending along the length of its respective wall 51', overhanging contact face 54' of web 50'.

In the embodiment of FIGS. 14–16, the spring wire clip 49 employed in the embodiment of FIGS. 6–10 is replaced with a clip 78 made of bent sheet material, such as a suitable metal. Clip 78 has a U-shaped central portion including a web 79 flanked by two upstanding walls 80. Extending laterally from the upper end of each wall 80 is a V-shaped springy arm 81.

Web 79 carries a resilient tongue 82 formed by cutting and bending a portion of the material of the web. Due to the inherent resilience of the sheet material from which clip 78 is formed, tongue 82 is connected to web 79 by a resilient hinge 83 defined by the fold line along which tongue 82 is bent out of the plane of web 79. Adjacent to the opening in web 79 created by bending tongue 82 out of the web is an opening 84 slightly larger in size than plastic body 28 of semiconductor device 27. Extending from each wall 80 is an attachment tab 85.

When assembling the heat dissipator with semiconductor device 27, device 27 is first placed on contact face 54' of body 48' with post 55' extending through the usual hole 62 provided in the thermal transmission plate 30 of the semiconductor device. This locates the semiconductor device so that leads 29 extend beyond the edge 63' of body 48', as shown in FIG. 15. Clip 78 is then held directly above body 48' and pushed downwardly toward contact face 54'. The outer surfaces of the upwardly diverging portions of springy arms 81 engage lips 77 and the arms are thereby urged resiliently toward each other. As the arms 81 slip past lips 77, they spring outwardly beneath the lips thereby locking clip 78 in the position shown in FIGS. 15 and 16. At this point, resilient tongue 82 presses down upon thermal transmission plate 30 of semiconductor device 27 thereby providing a high contact pressure between plate 30 and contact face 54' of body 48'. In addition, attachment tabs 85 project beyond the edge 63' of dissipator body 48'. Consequently, as described above, the free ends of leads 29 and tabs 85 can pass through openings in a printed circuit board 45 (FIG. 15) to permit connection of the leads to the electrical circuit carried by the board and soldering of tabs 85 to the board.

It will be appreciated that in each of the embodiments described above, the heat dissipator body can be formed of a relatively inexpensive, thermally conductive, material, such as aluminum, and the resilient clip can be formed of a solderable material. In this way, the clip can serve both to apply high contact pressure between the semiconducotr device and the contact face of the heat dissipator body, and a portion of the clip can be used to attach, by soldering, the semiconductor device and heat dissipator assembly to a support, such as a printed circuit board.

The invention has been shown and described in preferred form only, and by way of example, and many variations may be made in the invention which will still be comprised within its spirit. It is understood, threfore, that the invention is not limited to any specific form or embodiment except insofar as such limitations are included in the appended claims.

What is claimed is:

1. A heat dissipator for use with a semiconductor device which is to be mounted on a support, comprising:

a body of thermally conductive material having a face adapted to contact the semiconductor device, the body including locating means for defining the position of the semiconductor device with respect to the contact face, and the body having an edge beyond which the electrical leads of the semiconductor device extend when the device is located in its predefined position, and a clip for engaging the body and resiliently clamping the semiconductor device against the contact face, the clip being formed of a single length of bent spring wire, at least one of the free ends of the clip being an attachment element, which projects beyond said edge of the body when the clip is in its operative position on the body, for joining the body and hence the semiconductor device to the support.

2. A heat dissipator as defined in claim 1 wherein the clip is formed of a solderable material which is different from the material of which the body is formed.

3. A heat dissipator as defined in claim 1 wherein the two free ends of the length of wire each constitute one of said attachment elements.

4. A heat dissipator as defined in claim 1 including means carried by the body, and cooperable with the clip, defining a pivot axis about which the clip can pivot with respect to the body, and locking means carried by the body for holding the clip in a fixed position with respect to the body wherein the clip can resiliently press a semiconductor device against the contact face of the body.

5. A heat dissipator as defined in claim 4 wherein the body is a U-shaped member having two upstanding walls joined by a portion presenting the contact face, the means defining the pivot axis and the locking means being carried by the upstanding walls of the body.

6. A heat dissipator as defined in claim 5 wherein the central portion of the wire is adapted to press the semiconductor device against the contact face of the body, the portions of the wire at each side of the central portion being bent to form loops for cooperating with the pivot axis defining means of the body, and the two end portions of the wire defining spring arms adapted to engage the locking means of the body to lock the clip with respect to the body.

7. A heat dissipator as defined in claim 6 wherein the central portion of the wire extends across substantially the entire width of the contact face of the body from one of the upstanding walls to the other.

8. A heat dissipator as defined in claim 7 wherein the means defining the pivot axis include a projection extending from each upstanding wall of the body, each loop of the wire extending around one of the projections.

9. A heat dissipator as defined in claim 6 wherein the locking means includes a projection extending from each upstanding wall of the body, each spring arm of the wire engaging a side of the projection facing toward the contact face of the body.

10. A dissipator as defined in claim 6 wherein the free end of each end portion of the wire extends beyond the contour of the body to define said attachment elements.

11. A dissipator as defined in claim 1 wherein the central portion of the wire is adapted to press the semiconductor device against the contact face of the body, the ends of the wire defining arms of the clip, and the body having a channel on each side of the contact face for accommodating the arms of the clip.

12. A dissipator as defined in claim 11 wherein the clip arms are substantially straight, and the channels in the body are open at one of their ends so that the arms can be slipped lengthwise into the channels.

13. A dissipator as defined in claim 12 wherein the body carries means for maintaining the central portion of the wire in spaced relation to the contact face while the arms of the wire are being inserted into the channels, said maintaining means permitting the central portion of the wire to spring toward the contact face when the arms reach their final position of insertion into the channels.

14. A dissipator as defined in claim 13 wherein the maintaining means includes a ramp on the contact face which rises in the direction of movement of the clip as it is assembled with the body.

15. A dissipator as defined in claim 11 wherein the free end of each wire arm extends beyond the contour of the body to define said attachment element.

* * * * *